(12) United States Patent
Koo (10) Patent No.: US 7,286,000 B1
(45) Date of Patent: Oct. 23, 2007

(54) SEMICONDUCTOR DEVICE

(75) Inventor: Kie Bong Koo, Cheongju-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/463,648

(22) Filed: Aug. 10, 2006

(30) Foreign Application Priority Data

Dec. 28, 2005 (KR) .................. 10-2005-0132471

(51) Int. Cl.
H03H 11/26 (2006.01)
(52) U.S. Cl. ..................... 327/276; 327/261
(58) Field of Classification Search ............ None
See application file for complete search history.

(56) References Cited

U.S. PATENT DOCUMENTS

| 6,259,294 | B1 * | 7/2001 | Murakami et al. ......... 327/277 |
| 6,643,206 | B2 | 11/2003 | Shirley |
| 6,906,968 | B2 * | 6/2005 | Kim et al. ................. 365/194 |
| 7,109,775 | B2 * | 9/2006 | Tomita ..................... 327/278 |
| 2001/0012221 | A1 | 8/2001 | Shirley |
| 2004/0196080 | A1 * | 10/2004 | Akasaki et al. ........... 327/161 |
| 2005/0278596 | A1 * | 12/2005 | Miyajima et al. .......... 714/736 |

FOREIGN PATENT DOCUMENTS

| JP | 04-344398 | 11/1992 |
| JP | 09-288889 | 11/1997 |
| JP | 2002-117699 | 4/2002 |
| KR | 10-2004-0093823 | 11/2004 |
| KR | 10-2004-0105006 | 12/2004 |

* cited by examiner

Primary Examiner—Cassandra Cox
(74) Attorney, Agent, or Firm—Marshall, Gerstein & Borun LLP (57) ABSTRACT

A semiconductor device can accurately control the timings of various signals used in the semiconductor device using a simple configuration. The semiconductor device includes first fuse units which output first fuse signals, respectively, a first decoder which receives the first fuse signals respectively output from the first fuse units, and decodes the received first fuse signals, thereby outputting a plurality of first control signals, a first delay which controls a setup/hold time of input data in response to the first control signals, a second decoder which receives the first fuse signals, and decodes the received first fuse signals, thereby outputting a plurality of second control signals, a second delay which controls a DQSS time of a clock with respect to a data strobe signal in response to the second control signals, second fuse units which output second fuse signals, respectively, and a third decoder which receives the second fuse signals respectively output from the second fuse units, and decodes the received second fuse signals, thereby outputting a plurality of third control signals. Each of the first and second delays is determined to be enabled or disabled in response to a selected one of the third control signals.

21 Claims, 4 Drawing Sheets

FIG. 1

(PRIOR ART)

SEMICONDUCTOR DEVICE

BACKGROUND

1. Technical Field

This patent relates to a semiconductor device, and, more particularly, to a semiconductor device which can finely control various signals used in the semiconductor device using a simple configuration including a decoder for controlling conditions of the signals possibly given in controlling the timings of the signals, a decoder for controlling the timing of each signal, and fuse units for controlling the decoders, respectively.

2. Description of the Related Art

Generally, in a semiconductor device, input data input to the semiconductor device from the external of the semiconductor device is controlled in setup/hold time before being latched in accordance with a data strobe signal. The data latched in synchronism with the data strobe signal is re-latched in synchronism with a clock controlled in DQSS time. The resultant data is then transmitted via a global data bus line. Here, "strobe signal" generally means a control signal used for data transmission. Such a strobe signal is a short pulse signal which is usable in a computer system to achieve synchronization of data transmission. The above-mentioned data strobe signal means a signal which is used to control inputting of data such that the data is input in synchronism with rising and falling edges thereof. Also, "DQSS time" means a delay time from a rising edge of a clock, at which a write command is input, to a first rising edge of a DQS signal, namely, a data strobe signal. That is, the DQSS time is a timing margin between the data strobe signal and the clock. Generally, the above-mentioned setup/hold time and DQSS time are limited to certain ranges, respectively. For example, allowable ranges of the setup/hold time and DQSS time are stipulated in a specification of the Joint Electron Device Engineering Council (JEDEC) standard.

Figure 1:
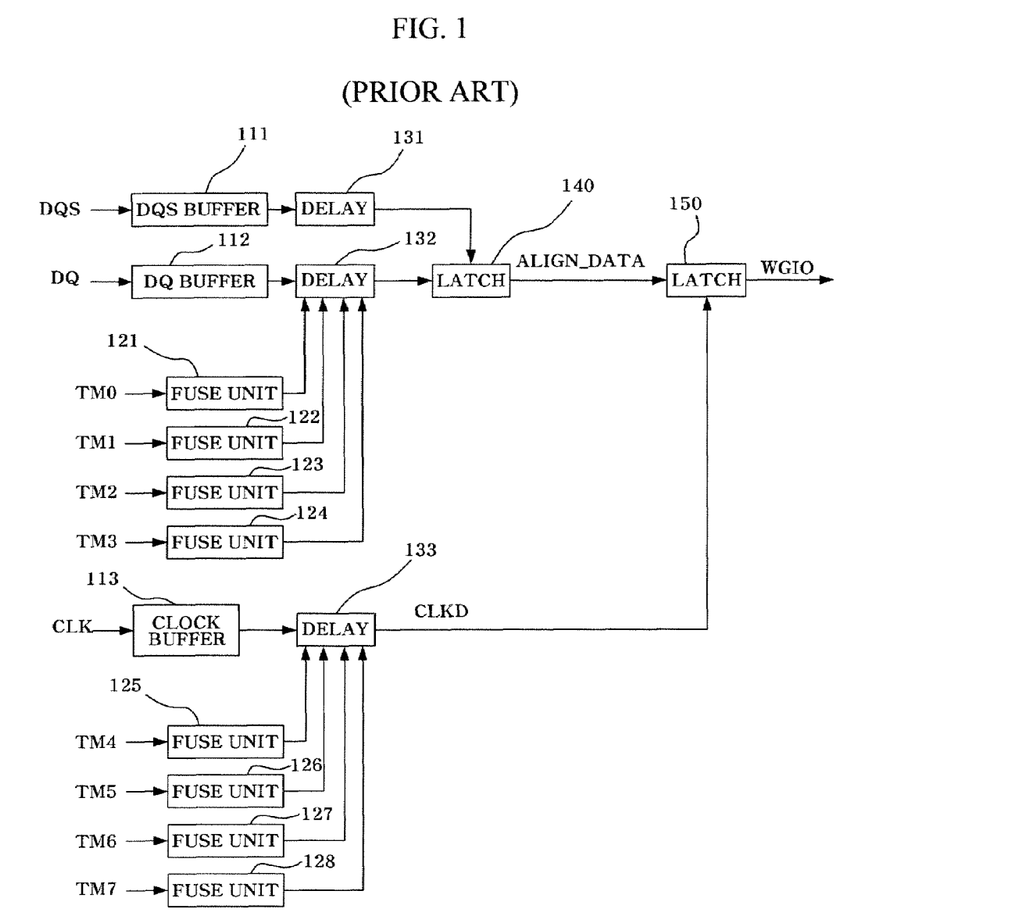
FIG. 1 is a block diagram illustrating a configuration of a conventional semiconductor device.

FIG. 1 is a block diagram illustrating a configuration of a conventional semiconductor device. A data input operation of the conventional semiconductor device will be described with reference to FIG. 1.

As shown in FIG. 1, input data DQ, which is input from the external of the semiconductor device, is buffered by a DQ buffer 112, and is then applied to a delay 132. The delay 132 is adapted to control the setup/hold time of the input data DQ buffered by the DQ buffer 1112. The delay 132 controls the delay time of the input data DQ in accordance with fuse signals respectively output from fuse units 121 to 124. That is, when test mode signals TM0 to TM3 are input to the fuse units 121 to 124, respectively, in a predetermined test mode, an appropriate delay time for controlling the setup/hold time of the input data DQ is determined. Based on the determined delay time, a selected one or ones of the fuses of the fuse units 121 to 124 are cut to determine a desired combination of fuse signals output from the fuse units 121 to 124. In accordance with the fuse signals output from the fuse units 121 to 124, the delay 132 controls the delay time, thereby controlling the setup/hold time.

A data strobe signal DQS is input to a DQS buffer 111 which, in turn, buffers the input data strobe signal DQS. The buffered data strobe signal DQS is applied to a delay 131 which, in turn, outputs the data strobe signal DQS after a predetermined delay time.

In synchronism with the data strobe signal DQS output from the delay 131, a latch 140 latches the delayed input data output from the delay 132, and outputs the resultant aligned input data ALIGN_DATA.

Meanwhile, a clock CLK is input to a clock buffer 113 which, in turn, buffers the input clock CLK. The buffered clock CLK is applied to a delay 133 which, in turn, outputs the clock CLK after a predetermined delay time, namely, a delayed clock CLKD. The delay 133 is adapted to control a DQSS time between the clock CLK buffered by the clock buffer 112 and the data ALIGN_DATA. The delay 133 controls the delay time of the clock CLK in accordance with fuse signals respectively output from fuse units 125 to 128. That is, when test mode signals TM4 to TM7 are input to the fuse units 121 to 124, respectively, in a predetermined test mode, an appropriate delay time for controlling the DQSS time is determined. Based on the determined delay time, a selected one or ones of the fuses of the fuse units 125 to 128 are cut to determine a desired combination of fuse signals output from the fuse units 125 to 128. In accordance with the fuse signals output from the fuse units 125 to 128, the delay 133 controls the delay time, thereby controlling the DQSS time.

The data ALIGN_DATA is latched by a latch 150 in synchronism with the delayed clock CLKD. The latch 150 transmits the latched data, namely, data WGIO, via a global data bus line.

In the above-mentioned conventional semiconductor device, however, there is a problem in that the circuit for controlling the timing of each signal used in the semiconductor device may be complicated as the number of possible conditions of the signal increases. As mentioned above, the conventional semiconductor device includes separate fuse units which are adapted to control individual signals whose timing is to be controlled, respectively. For this reason, when the number of signals to be controlled increases, the number of the fuse units must correspondingly be increased, thereby causing the circuit to be complicated. Furthermore, since each fuse unit is limitedly used, namely, is only used for a particular signal. For this reason, there is a problem in that the utility of the fuse unit is degraded. In addition, there is a problem in that the accuracy of the semiconductor device in controlling the timing of each signal per fuse unit is more or less inferior.

SUMMARY OF THE INVENTION

A semiconductor device can accurately control the timings of various signals used in the semiconductor device using a simple configuration.

In accordance with one aspect, a semiconductor device may include a plurality of first fuse units, each of which includes a fuse, and outputs a first fuse signal having a level determined in accordance with whether or not the fuse has been cut; a first decoder which receives the first fuse signals respectively output from the first fuse units, and decodes the received first fuse signals, thereby outputting a plurality of first control signals; a first delay which controls a timing of a predetermined first electric signal in response to the first control signals; a second decoder which receives the first fuse signals, and decodes the received first fuse signals, thereby outputting a plurality of second control signals; a second delay which controls a timing of a predetermined second electric signal in response to the second control signals; a plurality of second fuse units, each of which includes a fuse, and outputs a second fuse signal having a level determined in accordance with whether or not the fuse has been cut; and a third decoder which receives the second fuse signals respectively output from the second fuse units, and decodes the received second fuse signals, thereby outputting a plurality of third control signals, wherein each of the first and second delays is determined to be enabled or disabled in response to a selected one of the third control signals.

The first electric signal may be data input from an external of the semiconductor device in accordance with a write command, and the second electric signal is a predetermined clock signal.

The first delay may control a setup/hold time of the input data. The second delay may control a DQSS time of the clock signal.

Each of the first and second fuse units may further include a pull-up device which pulls up a first node in response to a predetermined test mode signal, a first pull-down device which pulls down the first node in response to a reset signal, a buffer which buffers a signal at the first node, and a second pull-down device which pulls down the first node in response to an output signal from the buffer. The fuse of the fuse unit may be arranged between the pull-up device and the first node.

Each of the first and second decoders outputs 2n signals when the number of the signals received by the decoder is n.

The first delay may include a first buffer which buffers the first electric signal, a delay which delays an output signal from the first buffer in response to the first control signals, a second buffer which buffers an output signal from the delay, a first transfer gate which transfers an output signal from the second buffer to an output terminal of the first delay in response to an enable state of the third control signal selected in association with the first delay, and a second transfer gate which transfers the first electric signal in response to a disable state of the selected third control signal.

The delay may include a plurality of capacitances which are arranged on a connection path between the first buffer and the second buffer, and are turned on/off in response to the first control signals.

The capacitances may comprise MOS transistors which have a common connection terminal of sources and drains connected to the connection path, and gates, to which the first control signals are applied, respectively.

The second delay may include a first buffer which buffers the second electric signal, a delay which delays an output signal from the first buffer in response to the second control signals, a second buffer which buffers an output signal from the delay, a first transfer gate which transfers an output signal from the second buffer to an output terminal of the second delay in response to an enable state of the third control signal selected in association with the second delay, and a second transfer gate which transfers the second electric signal in response to a disable state of the selected third control signal.

The delay may include a plurality of capacitances which are arranged on a connection path between the first buffer and the second buffer, and are turned on/off in response to the second control signals.

The capacitances may comprise MOS transistors which have a common connection terminal of sources and drains connected to the connection path, and gates, to which the second control signals are applied, respectively.

In accordance with another aspect, a semiconductor device may include a plurality of first fuse units, each of which includes a fuse, and outputs a first fuse signal having a level determined in accordance with whether or not the fuse has been cut; a first decoder which receives the first fuse signals respectively output from the first fuse units, and decodes the received first fuse signals, thereby outputting a plurality of first control signals; a first delay which controls a setup/hold time of input data in response to the first control signals; a second decoder which receives the first fuse signals, and decodes the received first fuse signals, thereby outputting a plurality of second control signals; a second delay which controls a DQSS time of a clock with respect to a data strobe signal in response to the second control signals; a plurality of second fuse units, each of which includes a fuse, and outputs a second fuse signal having a level determined in accordance with whether or not the fuse has been cut; and a third decoder which receives the second fuse signals respectively output from the second fuse units, and decodes the received second fuse signals, thereby outputting a plurality of third control signals, wherein each of the first and second delays is determined to be enabled or disabled in response to a selected one of the third control signals.

BRIEF DESCRIPTION OF THE DRAWINGS

Various features and advantages of the present invention will become more apparent after reading the following detailed description when taken in conjunction with the drawings, in which.

DETAILED DESCRIPTION

Hereinafter, the present invention will be described in detail, in conjunction with exemplary embodiments. These embodiments are used only for illustrative purposes, and the present invention is not limited thereto.

Figure 2:
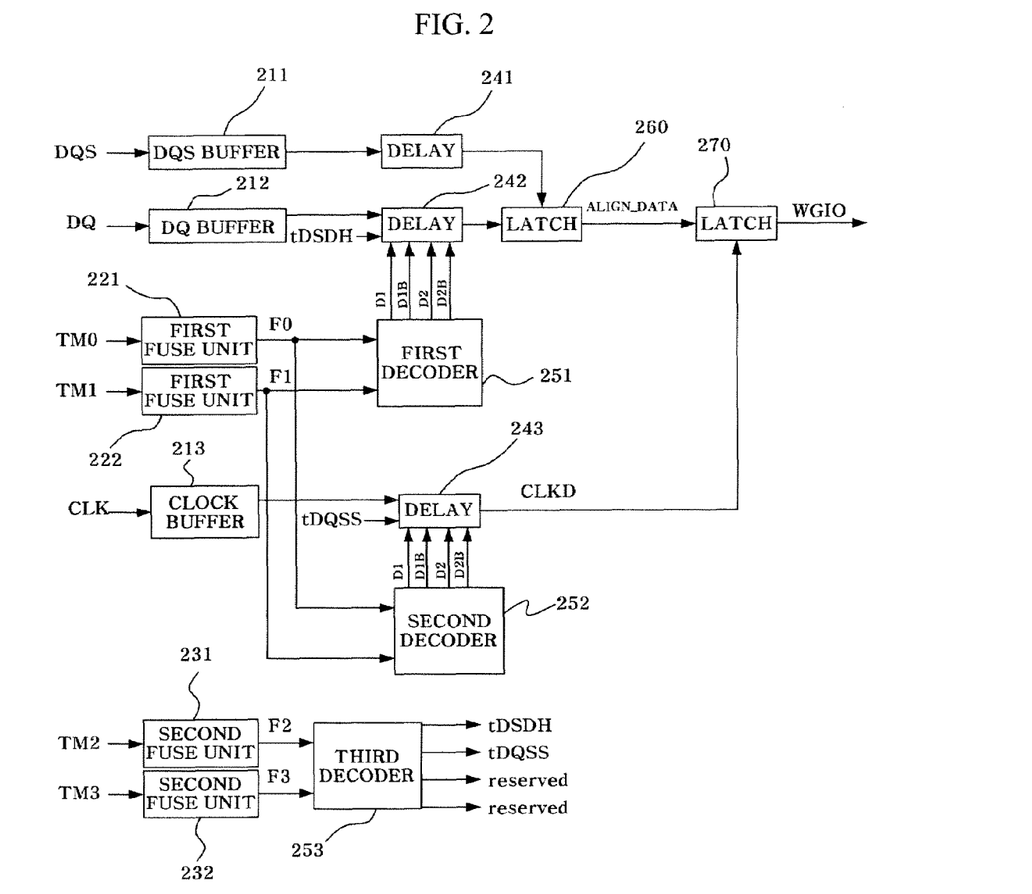
FIG. 2 is a configuration of a semiconductor device according to an exemplary embodiment.
Figure 3:
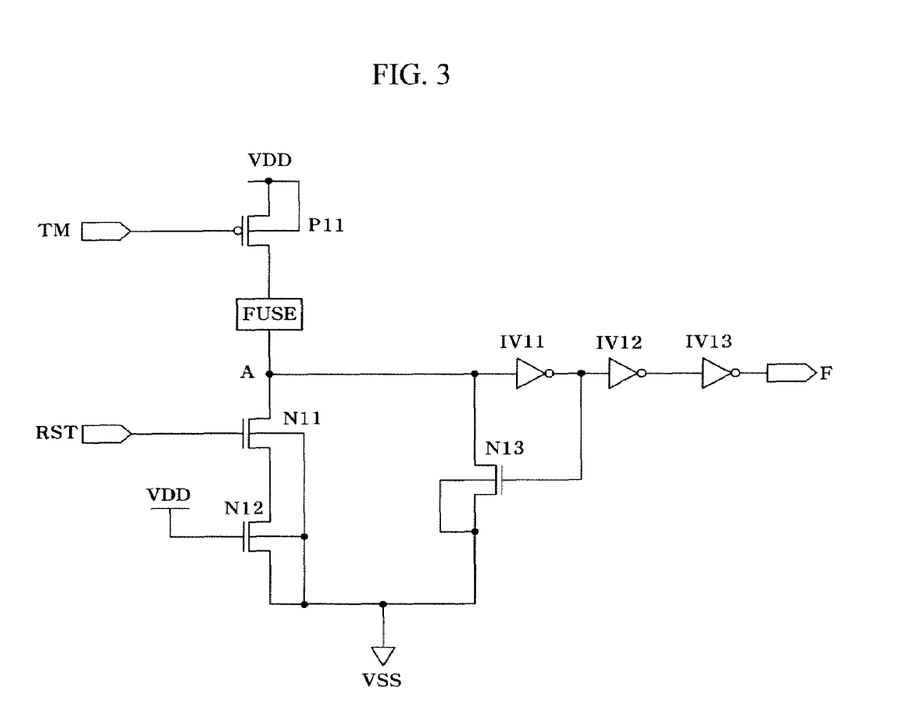
FIG. 3 is a circuit diagram illustrating a configuration of one of first and second fuse units used in the semiconductor device according to the illustrated embodiment.

FIG. 2 is a configuration of a semiconductor device according to an exemplary embodiment. The configuration of the semiconductor device according to the illustrated embodiment will be described in detail with reference to FIG. 2.

As shown in FIG. 2, the semiconductor device according to the illustrated embodiment includes a plurality of first fuse units, two first fuse units 221 and 222 in the illustrated case, which include fuses, respectively, and output first fuse signals F0 and F1 each having a level determined in accordance with whether or not the fuse of an associated one of the first fuse units 221 and 222 has been cut, respectively. The semiconductor device also includes a first decoder 251 which receives the first fuse signals F0 and F1, and decodes the received first fuse signals F0 and F1, thereby outputting a plurality of first control signals D1, D1B, D2, and D2B, and a delay 242 which controls a setup/hold time of input data in response to the first control signals D1, D1B, D2, and D2B. The semiconductor device further includes a second decoder 252 which receives the first fuse signals F0 and F1, and decodes the received first fuse signals F0 and F1, thereby outputting a plurality of second control signals D1, D1B, D2, and D2B, and a delay 243 which controls a DQSS time of a clock CLK for a data strobe signal DQS in response to the second control signals D1, D1B, D2, and D2B. The semiconductor device further includes a plurality of second fuse units, two second fuse units 231 and 232 in the illustrated case, which include fuses, respectively, and output second fuse signals F2 and F3 each having a level determined in accordance with whether or not the fuse of an associated one of the second fuse units 231 and 232 has been cut, respectively, a third decoder 253 which receives the second fuse signals F2 and F3, and decodes the received second fuse signals F2 and F3, thereby outputting third control signals tDSDH and tDQSS, a latch 242 which latches data output from the delay 242 in response to the data strobe signal DQS, and a latch 270 which latches data ALIGN_DATA output from the latch 260 in response to a clock CLKD output from the delay 243.

Operation of the semiconductor device having the above-described configuration will be described in detail with reference to FIGS. 2 to 6.

As shown in FIG. 2, in a predetermined test mode, test mode signals TM0 and TM1 are first input to the semiconductor device, to enable the semiconductor device to determine an appropriate delay time for the setup/hold time of input data DQ. Based on the result of the determination, it is determined which fuses of the first fuse units 221 and 222 should be cut, to select a combination of outputs of the first fuse units 221 and 222, namely, a combination of fuse signals. This will be described in more detail with reference to FIG. 3 which illustrates a configuration of one of the first fuse units 221 and 222. In a circuit of FIG. 3, when a test mode signal TM having a low level is input to the fuse unit in the test mode, a PMOS transistor (hereinafter, simply referred to as "PMOS") P11 is turned on, thereby causing a node A to be pulled up to a high level. In this state, a fuse signal F having a low level is output. On the other hand, when a test mode signal TM having a high level is input to the fuse unit in the test mode, the PMOS P11 is turned off. In this state, an NMOS transistor (hereinafter, simply referred to as "NMOS") N11 is turned on in response to a pulse type reset signal RST having a high level, thereby causing the node A to be pulled down. In this state, the fuse signal F output from the fuse unit has a high level. At this time, the node A is maintained at a low level in accordance with operation of an NMOS N13.

Thus, the first fuse units 221 and 222 output control signals F0 and F1 each having a high or low level determined in accordance with the level of the associated test mode signal TM0 or TM1, respectively. That is, the first fuse units 221 and 222 determine a combination of the control signals F0 and F1 enabling the delay 242 to generate a most appropriate setup/hold time or enabling the delay 243 to generate a most appropriate DQSS time. Based on the determined control signal combination, it is determined which fuses of the first fuse units 221 and 222 should be cut. If it is desired, in the fuse unit of FIG. 3, that the control signal F has a high level, the fuse of the fuse unit is cut, thereby causing the control signal F to have a high level. On the other hand, if it is desired for the control signal F to have a low level, the fuse of the fuse unit is not cut. In the latter case, the control signal F becomes a low level in response to a test mode signal TM having a low level.

Figure 5:
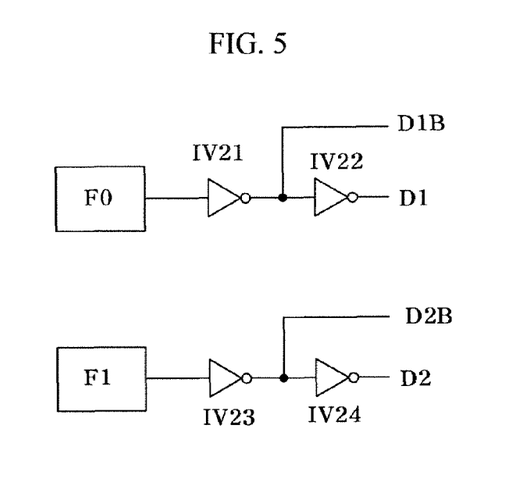
FIG. 5 is a circuit diagram illustrating a configuration of one of first and second decoders used in the semiconductor device according to the illustrated embodiment.

Thereafter, as shown in FIG. 5, which illustrates the configuration of one of the first and second decoders 251 and 252, the first decoder 251 receives the control signals F0 and F1, and decodes the received control signals F0 and F1, thereby generating a plurality of control signals D1, D1B, D2, and D2B for controlling the delay 242. As shown in FIG. 5, the second decoder 252 also receives the control signals F0 and F1, and decodes the received control signals F0 and F1, thereby generating a plurality of control signals D1, D1B, D2, and D2B for controlling the delay 243. Although the first and second decoders 251 and 252 in the illustrated embodiment have been described as having the same configuration, they may have different configurations to output different control signals, respectively.

Subsequently, in a predetermined test mode, test mode signals TM2 and TM3 are input to the semiconductor device, to enable the semiconductor device to determine whether or not it is necessary to control the setup/hold time of the input data DQ, and to control the DQSS time. Based on the results of the determination, it is determined which fuses of the second fuse units 231 and 232 should be cut, to select a combination of outputs of the second fuse units 231 and 232, namely, a combination of fuse signals. Since the second fuse units 231 and 232 have the configuration shown in FIG. 3, the basic operations thereof are identical to those of the first fuse units 221 and 222. Thus, the second fuse units 231 and 232 output control signals F2 and F3 each having a high or low level determined in accordance with the level of the associated test mode signal TM2 or TM3, respectively. That is, the second fuse units 231 and 232 determine a desired combination of the control signals F2 and F3 in accordance with whether or not it is necessary to control the setup/hold time of the input data DQ, and to control the DQSS time. Based on the determined control signal combination, it is determined which fuses of the second fuse units 231 and 232 should be cut. If it is desired, in the fuse unit of FIG. 3, that the control signal F has a high level, the fuse of the fuse unit is cut, thereby causing the control signal F to have a high level. On the other hand, if it is desired for the control signal F to have a low level, the fuse of the fuse unit is not cut. In the latter case, the control signal F becomes a low level in response to a test mode signal TM having a low level.

Figure 4:
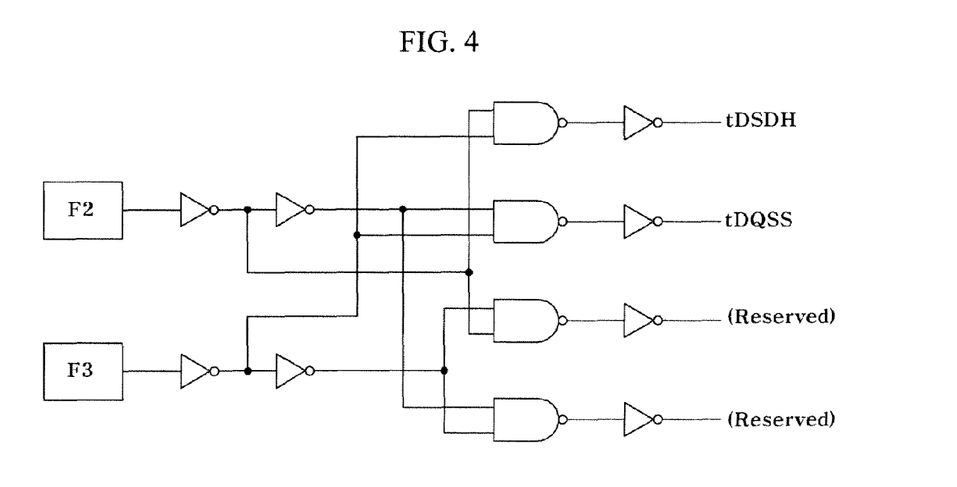
FIG. 4 is a circuit diagram illustrating a configuration of a third decoder used in the semiconductor device according to the illustrated embodiment.

Thereafter, as shown in FIG. 4, which illustrates the configuration of the third decoder 253, the third decoder 253 receives the control signals F2 and F3, and decodes the received control signals F2 and F3, thereby generating control signals tDSDH and tDQSS. The control signal tDSDH is used to control the delay 242, and thus, to control the setup/hold time. The control signal tDQSS is used to control the delay 243, and thus, to control the DQSS time. Accordingly, when it is necessary to control the data setup/hold time, both the fuses of the second fuse units 231 and 232 are not cut, thereby causing both the fuse signals F2 and F3 to have a low level. In this case, the control signal tDSDH has a high level. On the other hand, when it is necessary to control the DQSS time, the fuse of the second fuse unit 231 is cut to cause the fuse signal F2 to have a high level, and the fuse of the second fuse unit 232 is not cut to cause the fuse signal F3 to have a low level. In this case, the control signal tDQSS has a high level.

Remaining ones of the signals output from the third decoder 253, namely, two reserved signals, may be used to control timing characteristics other than the above-described timing characteristics. Although only one of the control signals tDSDH and tDQSS is enabled in accordance with the combination of the fuse signals F2 and F3 in the illustrated case, the third decoder 253 may be configured to simultaneously enable both the control signals tDSDH and tDQSS.

Meanwhile, the input data DQ, which is input to the semiconductor device from the external of the semiconductor device, is applied to the delay 242 after being buffered by a DQ buffer 212. The delay 242 is adapted to control the setup/hold time of the input data DQ buffered by the DQ buffer 212. The delay 242 controls the delay time of the input data DQ in accordance with the control signals D1, D1B, D2, and D2B output from the first decoder 251, thereby controlling the setup/hold time. The delay 242 is controlled by the control signal tDSDH output from the third decoder 253. Hereinafter, the operation of the delay 242 will be described in detail with reference to FIG. 6.

Figure 6:
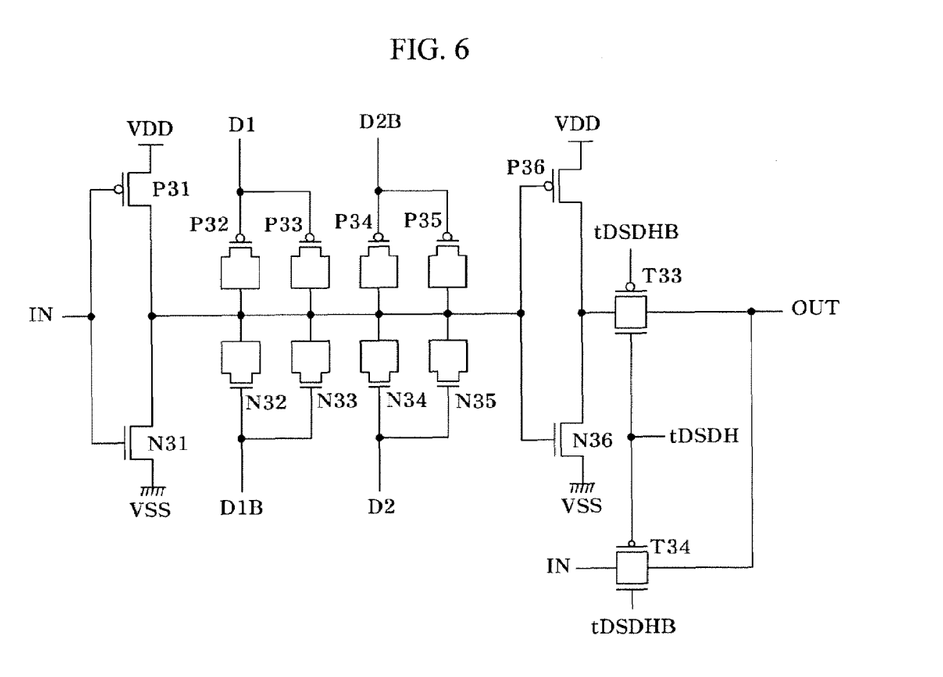
FIG. 6 is a circuit diagram illustrating a configuration of one of first and second delays used in the semiconductor device according to the illustrated embodiment.

In a configuration of the delay 242 shown in FIG. 6, when a control signal tDSDH having a low level is input to the delay 242, a transfer gate T33 is turned off, and a transfer gate T34 is turned on. In this case, accordingly, an input signal IN, namely, input data DQ, is outputted from the delay 242 without being delayed. On the other hand, when the control signal tDSDH has a high level, the transfer gate T33 is turned on, whereas the transfer gate T34 is turned off. Accordingly, the input signal IN, namely, the input data DQ, is buffered by a PMOS P31 and an NMOS N31, and is outputted after being delayed for a predetermined period of time in accordance with operations of PMOSs P32 to P35 and NMOSs N32 to N35. The delay period is determined based on the control signals D1, D1B, D2, and D2B applied to associated ones of the PMOSs P32 to P35 and NMOSs N32 to N35. That is, the capacitance of each of the PMOSs P32 to P35, and NMOSs N32 to N35 is finely varied in accordance with whether the PMOS or NMOS is turned on or off. In particular, the sources and drains of the PMOSs P32 to P35 and NMOSs N32 to N35 are connected at a common node, and the common node is connected to a data path. Accordingly, the capacitance of each MOS transistor is finely varied because a capacitance generated when the MOS transistor turns on is added to a junction capacitance originally present in the MOS transistor. Thus, it is possible to precisely control the setup/hold time of the input data DQ by determining respective levels of the control signals D1, D1B, D2, and D2B input to respective gates of the associated PMOSs and NMOSs to finely control the delay time of the input data DQ.

Thereafter, the latch 260 latches the delayed input data output from the delay 242 in synchronism with the data strobe signal DQS buffered by the DQS buffer 211 and delayed by the delay 241 for a predetermined period of time. As a result, aligned input data ALIGN_DATA is output from the latch 260.

Meanwhile, the clock CLK is input to the delay 243 after being buffered by the clock buffer 213. The delay 243 is adapted to control the DQSS time between the clock DQ buffered by the clock buffer 213 and the aligned input data ALIGN_DATA. The delay 243 controls the delay period of the clock CLK in accordance with the control signals D1, D1B, D2, and D2B output from the second decoder 252, thereby controlling the DQSS time. The operation of the delay 243 is controlled by the control signal tDQSS output from the third decoder 253. The detailed operation of the delay 243 is identical to that of the delay 242. That is, in a configuration of the delay 243 shown in FIG. 6, when a control signal tDQSS having a low level is input to the delay 243, an input signal IN, namely, the clock CLK, is output without delay. On the other hand, when a control signal tDQSS having a high level is input to the delay 243, the input signal IN, namely, the clock CLK, is output after being delayed for a predetermined period of time in accordance with operations of the PMOSs P32 to P35 and NMOSs N32 to N35. The delay period is determined based on the control signals D1, D1B, D2, and D2B. That is, the capacitance of each of the PMOSs P32 to P35, and NMOSs N32 to N35 is finely varied in accordance with whether the PMOS or NMOS is turned on or off. Thus, it is possible to precisely control the DQSS time by determining respective levels of the control signals D1, D1B, D2, and D2B input to respective gates of the associated PMOSs and NMOSs to finely control the delay time of the clock CLK.

Finally, the latch 270 latches the aligned data ALIGN_DATA in synchronism with the delayed clock CLKD output from the delay 243, and transmits the latched data, namely, data WGIO, via the global data bus line.

Thus, the semiconductor device according to the illustrated embodiment precisely control the setup/hold time of the input data DQ and the DQSS time associated with the input data DQ using a reduced number of fuse units by decoding the fuse signals F0 and F1 respectively output from the first and second fuse units 221 and 222 to finely control the delay of the input data DQ or the delay of the clock CLK. In addition, the semiconductor device according to the illustrated embodiment can individually determine, for a variety of signals, whether or not the timing of each signal should be controlled, using the signals obtained after decoding the fuse signals F2 and F3 output from the second fuse units 231 and 232.

While the described embodiment relates to a scheme for controlling a data setup/hold time and a DQSS time, it may also be used to control other objects.

As apparent from the above description, the described embodiment of a semiconductor device has an advantage in that it is possible to finely control various signals used in the semiconductor device using a simple configuration including a decoder which controls conditions of the signals possibly given in controlling the timings of the signals, a decoder which controls the timing of each signal, and fuse units which control the decoders, respectively.

Although the various embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
   a plurality of first fuse units, each of which includes a fuse, and outputs a first fuse signal having a level determined in accordance with whether or not the fuse has been cut;
   a first decoder which receives the first fuse signals respectively output from the first fuse units, and decodes the received first fuse signals, thereby outputting a plurality of first control signals;
   a first delay which controls a timing of a predetermined first electric signal in response to the first control signals;
   a second decoder which receives the first fuse signals, and decodes the received first fuse signals, thereby outputting a plurality of second control signals;
   a second delay which controls a timing of a predetermined second electric signal in response to the second control signals;

a plurality of second fuse units, each of which includes a fuse, and outputs a second fuse signal having a level determined in accordance with whether or not the fuse has been cut; and a third decoder which receives the second fuse signals respectively output from the second fuse units, and decodes the received second fuse signals, thereby outputting a plurality of third control signals, wherein each of the first delay and the second delay is determined to be enabled or disabled in response to a selected one of the third control signals.

2. The semiconductor device according to claim 1, wherein the first electric signal is data externally input to the semiconductor device in accordance with a write command, and the second electric signal is a predetermined clock signal.

3. The semiconductor device according to claim 2, wherein the first delay controls a setup/hold time of the data, and the second delay controls a DQSS time of the clock signal.

4. The semiconductor device according to claim 1, wherein each of the first and second fuse units further includes:
a pull-up device which pulls up a first node in response to a predetermined test mode signal;
a first pull-down device which pulls down the first node in response to a reset signal;
a buffer which buffers a signal at the first node; and
a second pull-down device which pulls down the first node in response to an output signal from the buffer,
wherein the fuse of the fuse unit is arranged between the pull-up device and the first node.

5. The semiconductor device according to claim 1, wherein each of the first and second decoders outputs $2^n$ signals when the number of the signals received by the decoder is n.

6. The semiconductor device according to claim 1, wherein the first delay includes:
a first buffer which buffers the first electric signal;
a delay which delays an output signal from the first buffer in response to the first control signals;
a second buffer which buffers an output signal from the delay;
a first transfer gate which transfers an output signal from the second buffer to an output terminal of the first delay in response to an enable state of the third control signal selected in association with the first delay; and
a second transfer gate which transfers the first electric signal in response to a disable state of the selected third control signal.

7. The semiconductor device according to claim 6, wherein the delay includes a plurality of capacitances which are arranged on a connection path between the first buffer and the second buffer, and are turned on/off in response to the first control signals.

8. The semiconductor device according to claim 7, wherein the capacitances comprise MOS transistors which have a common connection terminal of sources and drains connected to the connection path, and gates, to which the first control signals are applied, respectively.

9. The semiconductor device according to claim 1, wherein the second delay includes:
a first buffer which buffers the second electric signal;
a delay which delays an output signal from the first buffer in response to the second control signals;
a second buffer which buffers an output signal from the delay;
a first transfer gate which transfers an output signal from the second buffer to an output terminal of the second delay in response to an enable state of the third control signal selected in association with the second delay; and
a second transfer gate which transfers the second electric signal in response to a disable state of the selected third control signal.

10. The semiconductor device according to claim 9, wherein the delay includes a plurality of capacitances which are arranged on a connection path between the first buffer and the second buffer, and are turned on/off in response to the second control signals.

11. The semiconductor device according to claim 10, wherein the capacitances comprise MOS transistors which have a common connection terminal of sources and drains connected to the connection path, and gates, to which the second control signals are applied, respectively.

12. A semiconductor device comprising:
a plurality of first fuse units, each of which includes a fuse, and outputs a first fuse signal having a level determined in accordance with whether or not the fuse has been cut;
a first decoder which receives the first fuse signals respectively output from the first fuse units, and decodes the received first fuse signals, thereby outputting a plurality of first control signals;
a first delay which controls a setup/hold time of input data in response to the first control signals;
a second decoder which receives the first fuse signals, and decodes the received first fuse signals, thereby outputting a plurality of second control signals;
a second delay which controls a DQSS time of a clock with respect to a data strobe signal in response to the second control signals;
a plurality of second fuse units, each of which includes a fuse, and outputs a second fuse signal having a level determined in accordance with whether or not the fuse has been cut; and
a third decoder which receives the second fuse signals respectively output from the second fuse units, and decodes the received second fuse signals, thereby outputting a plurality of third control signals,
wherein each of the first and second delays is determined to be enabled or disabled in response to a selected one of the third control signals.

13. The semiconductor device according to claim 12, further comprising:
a first latch which latches data output from the first delay in response to the data strobe signal; and
a second latch which latches data output from the first latch in synchronism with a clock output from the second delay.

14. The semiconductor device according to claim 12, wherein each of the first and second fuse units further includes:
a pull-up device which pulls up a first node in response to a predetermined test mode signal;
a first pull-down device which pulls down the first node in response to a reset signal;
a buffer which buffers a signal at the first node; and
a second pull-down device which pulls down the first node in response to an output signal from the buffer,
wherein the fuse of the fuse unit is arranged between the pull-up device and the first node.

15. The semiconductor device according to claim 12, wherein each of the first and second decoders outputs $2^n$ signals when the number of the signals received by the decoder is n.

16. The semiconductor device according to claim 12, wherein the first delay includes:
   a first buffer which buffers the input data;
   a delay which delays an output signal from the first buffer in response to the first control signals;
   a second buffer which buffers an output signal from the delay;
   a first transfer gate which transfers an output signal from the second buffer to an output terminal of the first delay in response to an enable state of the third control signal selected in association with the first delay; and
   a second transfer gate which transfers the input data in response to a disable state of the selected third control signal.

17. The semiconductor device according to claim 16, wherein the delay includes a plurality of capacitances which are arranged on a connection path between the first buffer and the second buffer, and are turned on/off in response to the first control signals.

18. The semiconductor device according to claim 17, wherein the capacitances comprise MOS transistors which have a common connection terminal of sources and drains connected to the connection path, and gates, to which the first control signals are applied, respectively.

19. The semiconductor device according to claim 12, wherein the second delay includes:
   a first buffer which buffers the clock;
   a delay which delays an output signal from the first buffer in response to the second control signals;
   a second buffer which buffers an output signal from the delay;
   a first transfer gate which transfers an output signal from the second buffer to an output terminal of the second delay in response to an enable state of the third control signal selected in association with the second delay; and
   a second transfer gate which transfers the clock in response to a disable state of the selected third control signal.

20. The semiconductor device according to claim 19, wherein the delay includes a plurality of capacitances which are arranged on a connection path between the first buffer and the second buffer, and are turned on/off in response to the second control signals.

21. The semiconductor device according to claim 20, wherein the capacitances comprise MOS transistors which have a common connection terminal of sources and drains connected to the connection path, and gates, to which the second control signals are applied, respectively.

* * * * *